(12) United States Patent
Sommer

(10) Patent No.: US 7,939,946 B2
(45) Date of Patent: May 10, 2011

(54) CHIP WITH A VERTICAL CONTACT STRUCTURE

(75) Inventor: Michael Sommer, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 677 days.

(21) Appl. No.: 11/845,338

(22) Filed: Aug. 27, 2007

(65) Prior Publication Data

US 2008/0048341 A1 Feb. 28, 2008

(30) Foreign Application Priority Data

Aug. 25, 2006 (DE) .................. 10 2006 039 877

(51) Int. Cl.
*H01L 23/48* (2006.01)

(52) U.S. Cl. ................. 257/776; 257/773; 257/E23.01

(58) Field of Classification Search .............. 257/773, 257/776, E23.01
See application file for complete search history.

(56) References Cited

U.S. PATENT DOCUMENTS

| 5,835,396 | A  | * | 11/1998 | Zhang ........................ 365/51 |
| 5,943,255 | A  |   | 8/1999  | Kutter et al. |
| 6,528,885 | B2 |   | 3/2003  | Vajana et al. |
| 7,008,873 | B2 |   | 3/2006  | Chow et al. |
| 2002/0079564 | A1 | * | 6/2002 | Vajana et al. ............ 257/679 |
| 2005/0029654 | A1 |   | 2/2005 | Mio et al. |

FOREIGN PATENT DOCUMENTS

| AU | 2974297 | 12/1998 |
| DE | 197 13 173 C2 | 12/1998 |
| DE | 697 15 472 T2 | 4/2003 |
| DE | 102 21 657 A1 | 11/2003 |
| DE | 103 35 813 A1 | 3/2005 |
| EP | 1 193 758 A1 | 4/2002 |
| EP | 1 202 353 A1 | 5/2002 |
| WO | WO-98/57373 | 12/1998 |
| WO | WO-02/059967 A2 | 8/2002 |

* cited by examiner

*Primary Examiner* — Bradley K Smith
*Assistant Examiner* — Marvin Payen
(74) *Attorney, Agent, or Firm* — Dickstein Shapiro LLP

(57) ABSTRACT

A chip with a chip plane includes a functional area, a contact structure vertical with respect to the chip plane for connecting the functional area, which includes a conductive material, which has a predetermined length, and a vertical dummy-contact structure, which extends vertically into the functional area and which has an electrically conductive material and an insulation layer, the insulation layer being formed so that a current flow from an upper end of the dummy-contact structure to the functional area is prevented.

17 Claims, 10 Drawing Sheets

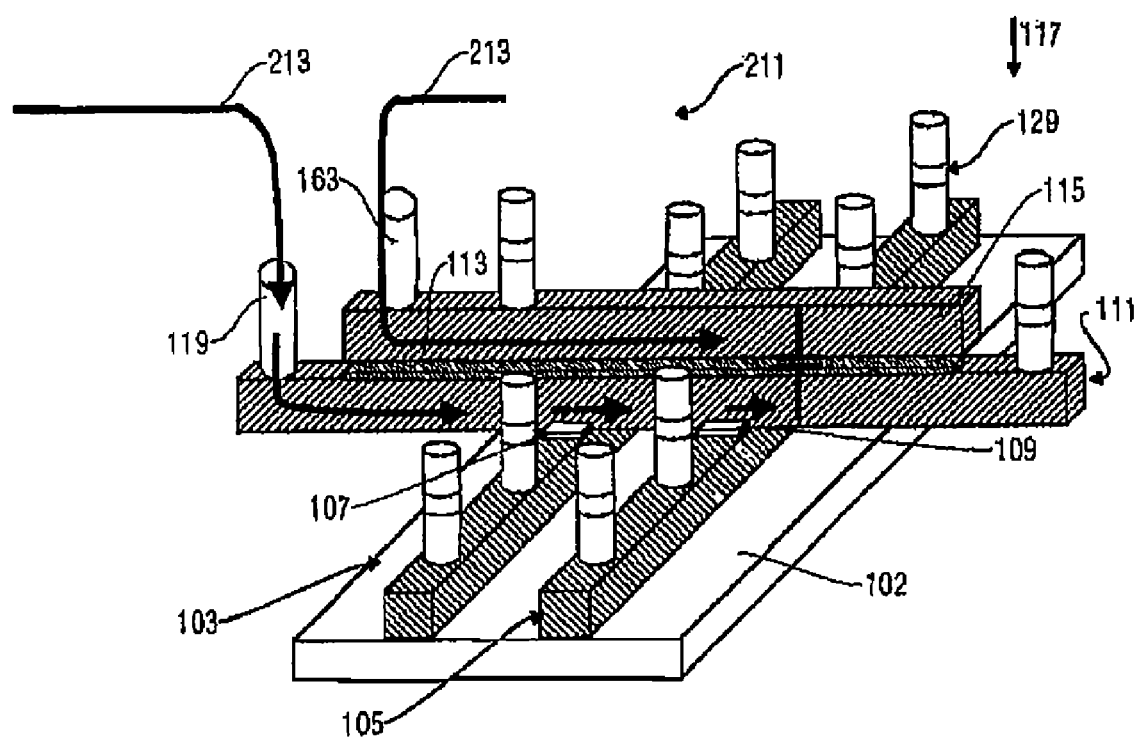

US 7,939,946 B2

CHIP WITH A VERTICAL CONTACT STRUCTURE

CROSS-REFERENCE TO RELATED APPLICATIONS

This application claims priority from German Patent Application No. 10 2006 039 877.7, which was filed on Aug. 25, 2006, and is incorporated herein in its entirety by reference.

TECHNICAL FIELD

The present invention refers to a chip with a vertical contact structure for connecting a functional area in the chip.

BACKGROUND

High requirements are put on chips or ChipCards (ChipCard=chip card) as regards data security and their programmed operation. Examples of chip cards are the so-called "Pay TV" card (Pay TV card=pay-television card), the debit card or the credit card, which are however only examples for a plurality of further cards. In chip cards, on which high requirements are put as regards data security, it should be avoided that the data of such a card or its operation can be reproduced in any form, so as to prevent for example a counterfeiter from producing a chip card with similar or identical characteristics.

A reproduction of a card could cause with a final distributor of the card or chip card substantial losses, the extent of which cannot be calculated. For example, a counterfeiter or an aggressor could reproduce or re-process a phone card or change its design so that the phone card can be loaded automatically and thus cause incalculable damage to a telephone company, which sells the phone cards with this design.

In order to be able to successfully commercialize a chip card, an appropriate certifying of the card or the design of the chip on the chip card is necessary. An as high-valued certifying as possible of a card is, e.g. for a manufacturer of the card, a substantial distinctive characteristic to be distinguished from his competitors. It is of crucial importance for the manufacturers of the card that, despite the many technical possibilities or the multiple technical means, with which the card can be attacked, a design of a chip card is so implemented that the chip card is nevertheless protected to a maximal extent against attacks. The fact that the more protection mechanisms are implemented in a design of a chip card, the more competitively the chip card can be commercialized e.g. with the card operators is applicable here.

An important protection mechanism should be provided on a card against attacks on the hardware itself or so-called "Invasive attacks". In the event of an invasive attack, a component or chip is opened, in order to obtain information on its construction, its architecture or the implemented circuits or the design. Furthermore, an invasive attack is carried out in order to obtain information on the functions of the chip, such as e.g. an implemented encrypting algorithm, or on data, which can e.g. be custom-specific and can be stored in a ROM (ROM=Read Only Memory). A series of companies have even specialized in so-called Reverse Engineering. By means of reverse engineering, e.g. a chip is reproduced by a foreign company based on the information, which has been obtained from an invasive attack.

In the case of the invasive attack, e.g. a component is systematically ground, a modification of the circuit implemented in a chip is carried out or a tension or signal measurement is performed. For an invasive attack can be used a series of tools, e.g. EBEAMs (EBEAM=elementary accelerator), which are used e.g. in electron-beam microscopes, FIBs (FIB=Focus Ion Beam) or AFMs (AFM=Atomic Force Microscope), the tools mentioned being only examples of a plurality of tools, which are used for carrying out an invasive attack.

In the framework of the invasive attack, pictures of a component are taken per surface of the complete chip surface, each metal plane and transistor plane being often contained in one picture. When the pictures thus taken are subsequently superimposed or the vertical structure of the component examined is reconstructed by means of the pictures of the different planes, a connection diagram of a chip can be extracted or established. By means of simple assumptions regarding the process and a subsequent determination of the dimensions of the individual components, such as e.g. the transistors, simulation models of the individual components can be made, by means of which the chip or the operation of the chip can be simulated or reproduced. Such a reproduction allows a counterfeiter to produce a copy or a modification of a chip providing data security and thus a chip card providing data security and thus to cause to a final distributor e.g. huge incalculable losses. Therefore, reproducing a chip by means of an invasive attack should be made more difficult, even better prevented or made impossible.

SUMMARY

A chip with a chip plane has a functional area, a contact structure vertical with respect to the chip plane for connecting the functional area, which includes a conductive material, which has a predetermined length, and a vertical dummy-contact structure, the vertical dummy-contact structure extending vertically into the functional area and having an electrically conductive material and an insulation layer, and the insulation layer being formed so that a current flow from an upper end of the dummy-contact structure to the functional area is prevented.

BRIEF DESCRIPTION OF THE DRAWINGS

Embodiments of the present invention will be detailed subsequently referring to the appended drawings, in which:

FIG. 10 shows a schematic view of an implementation of a capacitor by means of a transistor structure on a chip according to an embodiment of the present invention.

DETAILED DESCRIPTION

Figure 1:
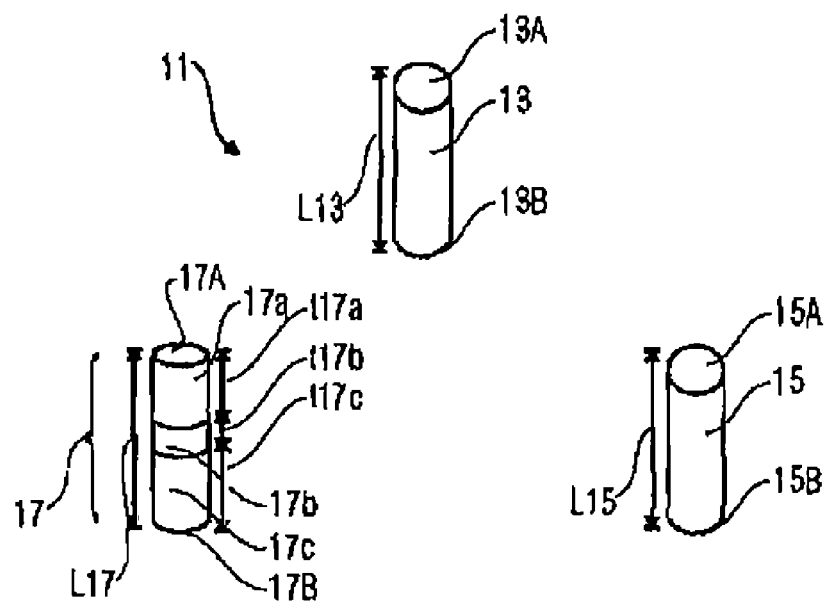
FIG. 1 shows a comparison of a vertical dummy-contact structure and a vertical contact structure in a chip according to an embodiment of the present invention.

FIG. 1 describes a comparison, with reference to a schematic sketch, of a vertical dummy-contact structure with two vertical contact structures, which are used on a chip according to an embodiment of the present invention, to connect a functional area in the chip, not shown in FIG. 1. A contact-structure arrangement 11 shown in FIG. 1 has a first vertical contact structure 13 with a first contact-structure length $L_{13}$, a second vertical contact structure 15 with a second contact-structure length $L_{15}$ and a dummy-contact structure 17 with a dummy-contact structure length $L_{17}$. The first vertical contact structure 13 extends from an upper end 13A of the first vertical contact structure 13 to a lower end 13B of the first vertical contact structure 13, while the second vertical contact structure 15 extends from an upper end 15A to a lower end 15B of the second contact structure 15. The first contact structure 13 has, on a path from the upper end 13A to the lower end 13B along the full length $L_{13}$ of the contact structure 13, a conductive material, so that the first vertical contact structure 13 can be used in order to electrically connect the upper end 13A to a functional area, not shown, in the chip according to an embodiment of the present invention, the functional area of the chip being adjacent to the lower end 13B. The same also applies to the second contact structure 15, which has a conductive material on a path from the upper end 15A to the lower end 15B over the full second contact-structure length $L_{15}$, so that the second vertical contact structure 15 can also generate a conductive connection between the upper end 15A and the functional area, which is adjacent to the lower end 15B.

The dummy-contact structure 17 has an upper contact area 17a, an insulation layer 17b and a lower contact area 17c, the insulation layer 17b being adjacent to the upper contact area 17a and to the lower contact area 17c and arranged between the latter. The upper contact area 17a has a thickness $t_{17a}$ or a vertical extension $t_{17a}$, while the insulation layer 17b is characterized by a thickness $t_{17b}$ or a vertical extension $t_{17b}$. The lower contact area 17c has a thickness $t_{17c}$, which corresponds to a vertical extension $t_{17c}$ of the lower contact area.

The insulation layer 17b serves, in the dummy-contact structure 17, to electrically insulate the upper contact area 17a, which has a conductive material, from the lower contact area 17c, which has also a conductive material, so that a current flow from an upper end 17A of the dummy-contact structure 17 to a lower end 17B of the dummy-contact structure 17, to which the functional area, not shown, of the chip is adjacent, is prevented.

The advantage of the contact-structure arrangement 11 on a chip according to an embodiment of the present invention is that an aggressor, who carries out an invasive attack and takes a picture of the contact-structure arrangement at the upper ends 13A, 15A, 17A, cannot identify based on this picture the contact structures 13, 15, 17 through which the functional area of the chip is connected, and the contact structures through which the functional area of the chip is not connected. Because the insulation layer 17b in the dummy-contact structure 17 cannot be identified in the picture or the photograph taken from above of the contact structures 13, 15, 17. Thus, an aggressor, who performs an invasive attack would assume, if he does not know e.g. that the dummy-contact structure 17 is arranged on the chip examined, that all the contact structures 13, 15, 17 serve for electrically connecting in each case the upper ends 13A, 15A, 17A, through the lower ends 13B, 15B, 17B, to the functional area in the chip.

When the aggressor draws conclusions, based on the pictures of the upper ends 13A, 15A, 17A, on a functionality of a circuit implemented in the chip, and tries to reconstruct its function e.g. in a simulation, he would come to false results or conclusions. Thus, the arrangement of the dummy-contact structure 17 in the contact-structure arrangement 11 makes more difficult or prevents an analysis of the functionality of the circuit implemented on the chip or thus makes more difficult or prevents a reproduction of the chip according to an embodiment of the present invention with the contact-structure arrangement 11.

The insulation layer 17b is formed, e.g. during a process step, wherein a horizontal extending layer of insulating material, not shown here, is generated in the chip, by structuring the layer with the insulating material. Thus, during the production of the chip, a further process step, which would serve to exclusively produce the insulation layer 17b, is omitted.

The insulation layer 17b can thus be made e.g. identical to an insulation material between two different metal planes on the chip, wherein here, e.g. in a chip according to an embodiment of the present invention, the insulation materials PSG (PSG=phosphorus silicate glass), BPSG (BPSG=boron-phosphorus silicate glass) or TEOS (TEOS=Tetra-Ethyl-Ortho-Silicate), which are used as insulation material between the metal planes on the chip, find application. Furthermore, materials formed chemically similar to the above-mentioned insulation materials can however also be used.

Particularly advantageous for a chip according to an embodiment of the present invention, wherein the insulation layer 17b or the interface layer is made out of said insulation materials is the fact that these insulation materials can very easily be etched, so that a selective etching in which the insulation layer would remain as a defect and would thus be identifiable in a picture taken from above of the chip, is made more difficult. Thus, an identification of a difference between the vertical contact structures 13, 15 and the dummy-contact structure 17 is made more difficult or impossible for an aggressor, who carries out an invasive attack. A top view of the opened chip, even after a selective etching, thus once again only leads to a confusion of the aggressor, who carries out an invasive attack, and at the same time makes it more difficult for him to obtain information on the circuit design.

Particularly advantageous is the use of the dummy-contact structures 17 in a chip according to an embodiment of the present invention, when the dummy contacts or unused or false contacts in a kind of modified place-and-route algorithm are interconnected according to the random principle. In a way similar to a generation of filling structures, the dummy-contact structures 17 are connected according to the random principle or stochastically to dummy signals that are confusing for an aggressor. This makes more difficult for an aggressor an analysis or a reproduction of the chip according to an embodiment of the present invention, on which the vertical dummy-contact structures 17 are arranged together with the vertical contact structures 13, 15.

In a chip according to an embodiment of the present invention the thickness $t_{17b}$ is advantageously small with respect to the length $L_{15}$ of the vertical contact structure 15, a ratio between the thickness $t_{17b}$ of the insulation layer and the length $L_{15}$ of the contact structure 15 being e.g. smaller than 0.5 in a chip according to an embodiment of the present invention or even, in a chip according to another embodiment of the present invention, smaller than 0.2. In order to make an identification of the vertical dummy-contact structure 17 even more difficult for the aggressor, who carries out an invasive attack, it is advantageous, in the chip according to an embodiment of the present invention, to fix the dimensions of the dummy-contact structure 17 so that a dimension of the dummy-contact structure is, to within a 10% deviation, equal to the dimension of the vertical contact structure 13, 15.

Advantageously, in a chip according to an embodiment of the present invention, the contact-structure arrangement 11 explained in FIG. 1 can be combined with a series of further measures against an invasive attack. One of these further measures is to implement the circuit in the chip according to an embodiment of the present invention according to a technology of the smallest feature size, so that the taking of structure images is made more difficult. A further measure, which can be used in combination with the contact-structure arrangement 11 in the chip according to an embodiment of the present invention is a so-called active shielding. In the case of an active shielding, a metal plane is implemented on the chip, after a damaging or destruction of which the chip can no longer be operated in its specified functionality. When an aggressor attacks this metal plane in the framework of an invasive attack, e.g. during an etching or grounding operation, the chip can no longer be operated according to its specified functionality, so that the aggressor can no longer draw any conclusions on the functionality.

Another measure, which, in combination with the contact-structure arrangement 11 shown in FIG. 1, makes more difficult an analysis of the functionality of the chip consists in encrypting the data transmitted on the data busses on the chip or in transmitting or sending so-called dummy data on such busses, so that an aggressor, who connects such a data bus to a measuring electrode or a contact electrode cannot detect or measure any data, which allow him to draw conclusions on the functionality of the chip. It is in addition advantageous to examine the data lines arranged on the chip according to an embodiment of the present invention in order to know whether data have been applied from outside, e.g. through the measuring electrodes or contact electrodes, on the data lines or the bus.

In other words, the data lines or the data transported through same are checked as to their random distribution, in order to prevent applying data on the bus from outside. Thus, the possibility is eliminated for an aggressor to check, by means of measuring electrodes, whether the contact structure electrically connected to the measuring electrode is a vertical contact structure for connecting the functional area or a dummy-contact structure.

The measures enumerated here are only examples for a series of further measures, which are implemented e.g. in a chip according to an embodiment of the present invention in addition to the contact-structure arrangement 11 shown in FIG. 1. Thus, fifty other safety measures are implemented e.g. in a chip card controller on a chip according to an embodiment of the present invention.

Figure 2:
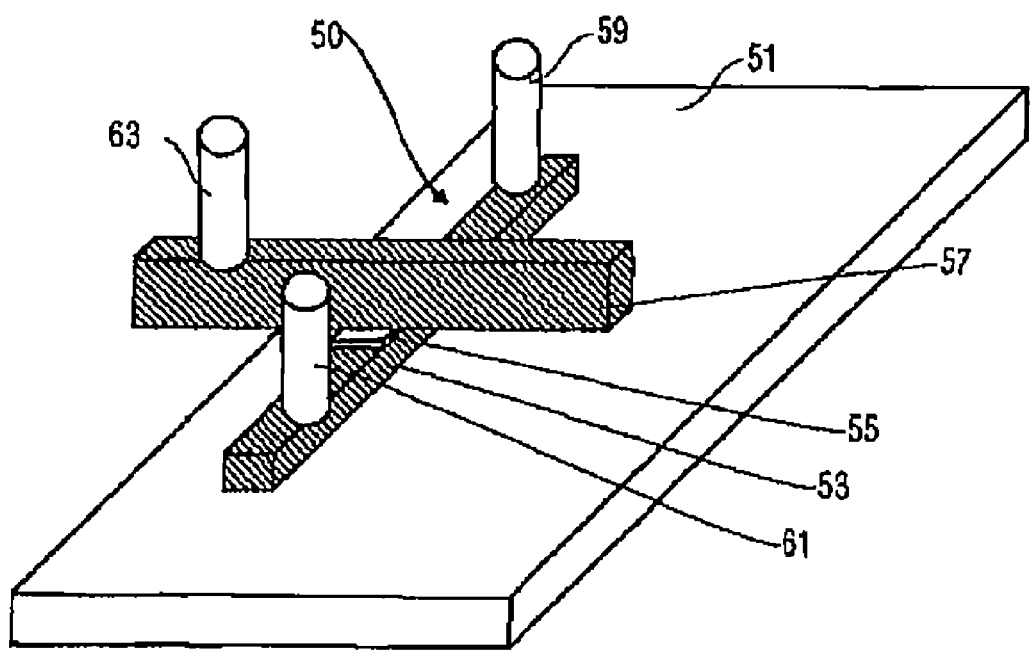
FIG. 2 shows a schematic view of an implementation of a transistor, which serves to explain the operation of a transistor on a chip according to an embodiment of the present invention.

In order to explain the operation of the contact-structure arrangement 11 shown in FIG. 1 in a chip according to an embodiment of the present invention, in FIG. 2 is shown a schematic view of a construction of a transistor structure 50 without dummy-contact structure. In the transistor structure 50, on a substrate 51 is arranged an active area 53 on which is, here too, arranged a gate oxide 55. Above the gate oxide 55 is arranged a gate electrode or gate conductive trace 57.

On the active area 53 are arranged a first vertical connection contact 59 and a second vertical connection contact 61, which are electrically connected to the active area 53, and which extend upwardly from the active area, between the first vertical connection contact 59 and the second vertical connection contact 61 being arranged the gate electrode 57. A vertical control contact 63 is arranged on the gate electrode 57 and serves for connecting the gate electrode 57. The transistor structure 50 is electrically separated or insulated from the substrate 51 by means of a so-called STI (STI=Shallow Trench Insulation). The STI is arranged between the active area 53, the gate oxide 55, the gate electrode 57 and the contacts 61, 63, on the one hand, and the substrate 51, on the other hand, so that no current flow is possible through the substrate 51.

In the transistor structure 50, a potential at the gate electrode is adjusted through the control contact 63 conductively connected to the gate electrode 57. The potential at the gate electrode 57 serves to exert an influence on an electrical field in the active area 53 under the gate electrode 57 or in a trench area of the field-effect transistor thus formed and to thus impede a current flow between the connection contacts 59, 61.

When one of the contacts 59, 61, 63 is replaced by the vertical dummy-contact structure 17 shown in FIG. 1, this difference with respect to the transistor structure 50 shown in FIG. 2 cannot be identified by an aggressor, who takes a picture from above of the transistor structure 50. However, by replacing a contact structure by a dummy-contact structure, the functionality of the transistor structure 50 is changed at the same time, so that the transistor structure can no longer operate according to its originally specified functionality. Because, when the connection contacts 59, 61 are replaced by the dummy-contact structure 17, a current flow in the active area 53 is prevented or, when the vertical control contact 63 is replaced by the dummy-contact structure 17, the potential at the gate electrode can no longer be adjusted with sufficient accuracy to achieve a functionality for a typical transistor structure with these dimensions and materials.

However, since the aggressor cannot identify the dummy-contact structure 17 in a picture or a photo taken from above, he concludes that the transistor structure 50 shown in FIG. 2 is implemented on the chip according to an embodiment of the present invention. Due to the resulting wrong conclusions, the aggressor performs, based on the results of the invasive attack, e.g. an incorrect simulation, wherefore a reproduction of the examined or analyzed chips is, as a matter of fact, made more difficult.

Figure 3A:
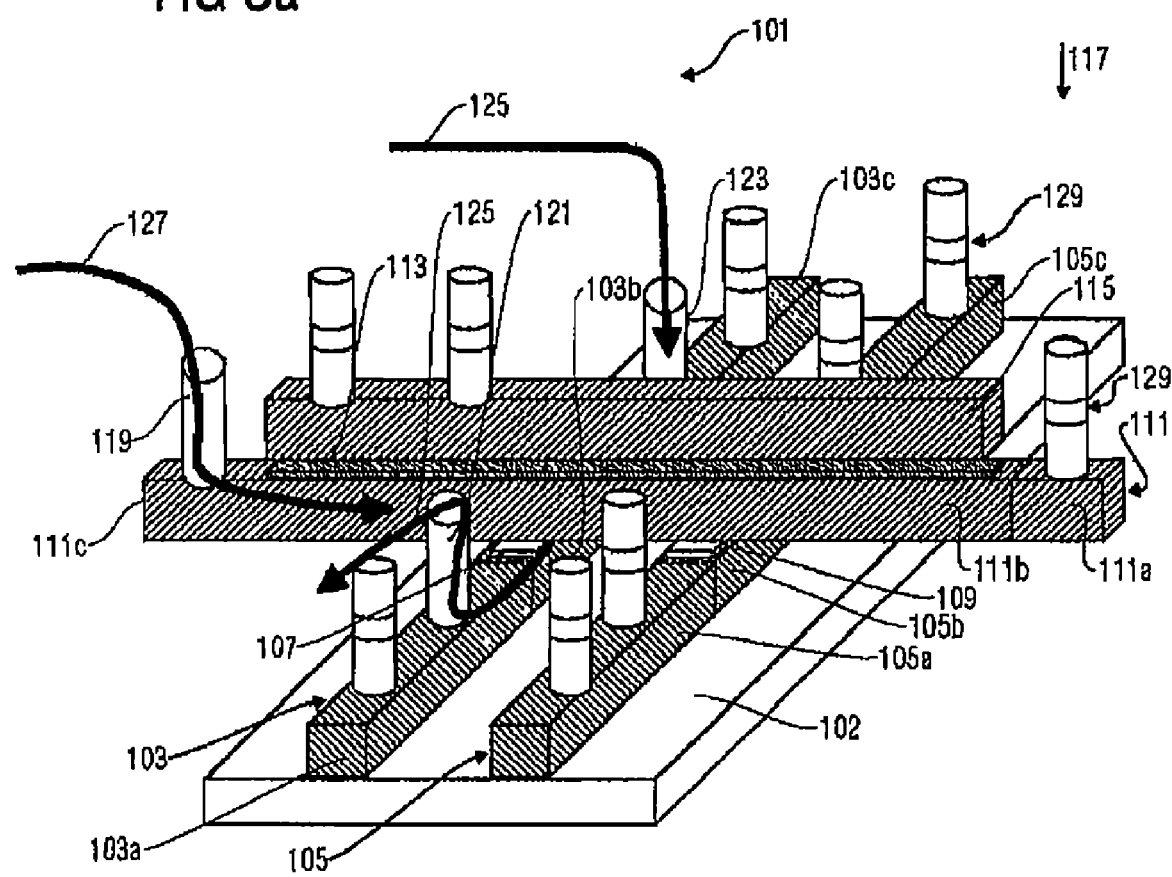
FIG. 3A shows a schematic view of a transistor on a chip according to an embodiment of the present invention, the transistor having a direct contacting on a lower poly layer.

FIG. 3A shows a schematic view of a transistor 101 on a chip according to an embodiment of the present invention. The transistor 101 is arranged on a substrate 102. On the substrate 102 are arranged two active areas 103, 105 spaced from each other, i.e. the first active area 103 and the second active area 105. The active areas 103 and 105 are separated from each other by a recess between the first active area 103 and the second active area 105. Above the first active area 103 is arranged a first gate oxide 107, which covers part of the first active area 103, and above or on the second active area 105 is arranged a second gate oxide 109, which covers part of the second active area 105.

Above the gate oxides 107, 109 is arranged a first polysilicon conductive trace 111, which intersects the two active areas 103, 105, and which is so positioned with respect to the two active areas 103, 105 that the first gate oxide 107 and the second gate oxide 109 are arranged between the active areas 103, 105 and the first polysilicon conductive trace 111. Above the first polysilicon conductive trace 111 is formed an insulation layer 113, above which is, in turn, arranged a second polysilicon conductive trace 115, so that the insulation layer 113 is positioned between the first polysilicon conductive trace 111 and the second polysilicon conductive trace 115. In a chip according to an embodiment of the present invention, the insulation layer 113 is implemented as an ONO layer (ONO layer=oxide nitride oxide layer). The active areas 103, 105 are separated from each other by the STI, here not shown.

Figure 3B:
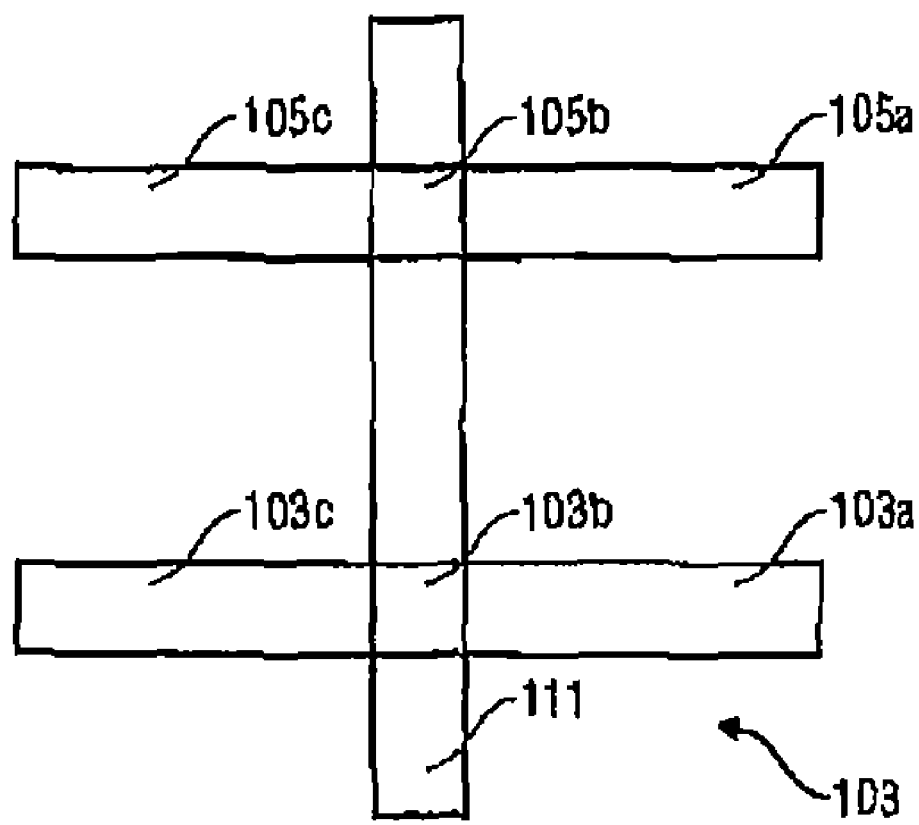
FIG. 3B shows a bottom view of the structural construction of the transistor of FIG. 3A.

The active areas 103, 105 are subdivided into sub-areas 103a-103c, 104a-105c, the first sub-area 103a of the active area 103 protruding in a bottom view, thus viewed from the substrate 102, which is shown in FIG. 3B, with respect to a second sub-area 103b, which overlaps with the first polysilicon conductive trace 111.

In the bottom view shown in FIG. 3B, one can see, in addition, that the first sub-area 103a is adjacent to the second sub-area 103b and does not overlap with the first polysilicon conductive trace 111. The third sub-area 103c is arranged on a side of the second sub-area 103b facing away from the first sub-area 103a, is adjacent to the second sub-area 103b and does, in the bottom view, neither overlap with the first conductive trace 111.

The first sub-area 105a of the second active area 105 is defined as the sub-area of the second active area 105 in which the second active area 105 does not overlap with the first polysilicon conductive trace 111 and is thus defined, in the bottom view in FIG. 3B, as the area of the second active area 105 that is protruding with respect to the second sub-area 105b of the second active area 105. The second sub-area 105b of the second active area 105 overlaps, in the bottom view, with the first polysilicon conductive trace 111 and is adjacent to the first sub-area 105a. The third sub-area 105c of the second active area 105 is arranged on the side of the second sub-area 105b facing away from the first sub-area 105a and is adjacent to the second sub-area 105b, wherein the third sub-area 105c of the second active area 105 in the view shown in FIG. 3B does not overlap with the first polysilicon conductive trace 111.

In a top view of the transistor structure 101 in a direction 117 vertical to a chip plane can be seen the sub-areas 103a, 103c, 105a, 105c, while the sub-areas 103b, 105b are covered by the polysilicon conductive traces 111, 115. The direction 117 of the top view is defined so that it corresponds to a frontal view of the surface of the substrate 102 facing toward the transistor 101 or, in other words, corresponds to a viewing direction from above on the transistor 101 shown in FIG. 3A.

The first polysilicon conductive trace 111 is subdivided into three sub-areas 111a-c, as shown in FIG. 3A, of which the first sub-area 111a is the area in which the conductive trace 111 protrudes with respect to a second sub-area 111b, which overlaps with the second polysilicon conductive trace 115, in the plan view in the direction 117 vertical to the chip plane, and thus does not overlap with the second polysilicon conductive trace. The first sub-area 111a is adjacent to the second sub-area 111b. The third sub-area 111c of the first polysilicon conductive trace 111 is adjacent to the second sub-area 111b of the first polysilicon conductive trace 111, and defined by the fact that the third sub-area 111c is the sub-area of the first polysilicon conductive trace 111, which protrudes in the plan view in the vertical direction 117 with respect to the second polysilicon conductive trace 115, so that the third sub-area 111c of the first polysilicon conductive trace 111 in the plan view in the direction 117 vertical to the chip plane does not overlap with the second polysilicon conductive trace 115.

More exactly, one could even speak of a subdivision of the first polysilicon conductive trace 111 into seven sub-areas or sections, of which a first section corresponds to the first sub-area 111a, a second section that is adjacent to the first section overlaps with the second polysilicon conductive trace 115 and does not overlap with the second gate oxide 109, and a third section overlaps with the second gate oxide 109. A fourth section of the first polysilicon conductive trace 111 is then arranged between the third section and a fifth section, the fifth section of the first polysilicon conductive trace 111 overlapping with the first gate oxide 107, while a sixth section of the first polysilicon conductive trace 111 is arranged between the fifth section and a seventh section of the first polysilicon conductive trace, the seventh section corresponding to the third sub-area 111c.

On the first polysilicon conductive trace 111 is arranged a lower vertical conductive trace contact structure 119, which extends in the direction 117 vertical to the chip plane so that it is adjacent to the third sub-area 111c of the first polysilicon conductive trace 111 and connected to the latter. On the first sub-area 103a of the first active area 103 is arranged a first vertical contact structure 121, which extends from above in the direction 117 vertical to the chip plane downward to the first sub-area 103a of the first active area 103 and connects the latter. On the third sub-area 103c of the first active area 103 is arranged a second vertical contact structure 123, which extends in the direction 117 from above to the first active area 103 so that it is adjacent to the first active area 103a and connects the first active area 103.

Through the lower vertical conductive trace contact structure 119, a potential is adjusted at the first polysilicon conductive trace 111, which serves in the transistor 101 as a gate electrode. In this case, one also speaks of a direct via of the lower or lowest poly layer among the two polysilicon conductive traces 111, 115, since the conductive trace contact structure 119 extends up to the lower or first polysilicon conductive trace 111. Through the potential adjusted at the first polysilicon conductive trace 111, a current flow, the direction of which is shown by arrows 125, can be controlled, the vertical contact structures 121, 123 serving, as already explained, in the transistor shown in FIG. 3A for connecting the source or drain area formed in the first active area 103. In the transistor 101 shown in FIG. 3A is arranged under the first gate oxide 107 on a chip according to an embodiment of the present invention a trench area, not shown here, the resistance of which is adjusted, through the potential at the first polysilicon conductive trace 111, so that the amplitude of the current flow from the second vertical contact structure 123 to the first vertical contact structure 121 can thus be controlled.

An arrow 127 explains a direction of a current flow, which occurs e.g. when the potential at the first polysilicon conductive trace 111, and thus at the gate electrode of the transistor 101, is changed.

Formed on the second polysilicon conductive trace 115 are two vertical dummy-contact structures 129, which extend from above to the second polysilicon conductive trace 115 and are adjacent to the latter. Furthermore, the vertical dummy-contact structure 129 is arranged on the first sub-area 111a of the first polysilicon conductive trace 111, and is adjacent to the first polysilicon conductive trace 111. Furthermore, the dummy-contact structure 129 is arranged on the first sub-area 103a of the first active area 103 and on the third sub-area 103c of the first active area 103, the first vertical contact structure 121 being positioned on the first sub-area 103a of the first active area 103 between the vertical dummy-contact structure 129 and the first polysilicon conductive trace 111. The second vertical contact structure 123 is arranged between the vertical dummy-contact structure 129 on the third sub-area 103c of the first active area 103 and the first polysilicon conductive trace 111. The vertical dummy-contact structures 129 arranged on the first sub-area 103 and on the third sub-area 103c are spaced from the first polysilicon conductive trace 111 and the vertical contact structures 121, 123.

On the second active area 105, the two vertical dummy-contact structures 129 are arranged on the first sub-area 105a and the two vertical dummy-contact structures 129 are arranged on the third sub-area 105c. The distance between the inner dummy-contact structure 129, which is arranged on the first sub-area 105a of the second active area 105 between the first polysilicon conductive trace 111 and the outer dummy-contact structure 129, and the first polysilicon conductive trace 111 is, to within a 10% deviation, equal to the distance between the first vertical contact structure 121 and the first polysilicon conductive trace 111. The distance between the outer dummy-contact structure 129 on the first sub-area 105a of the second active area 105 and the inner dummy-contact structure 129 is, to within a 10% deviation, equal to a distance between the dummy-contact structure 129 on the first sub-area 103a of the first active area 103 and the first vertical contact structure 121. The same also applies to the arrangement of the second vertical contact structure 123 and the dummy-contact structures 129 in the third sub-areas 103c, 105c. A distance between the inner dummy-contact structure 129, which is arranged on the third sub-area 105c of the second active area 105 between the first polysilicon conductive trace 111 and the outer dummy-contact structure 129, and the first polysilicon conductive trace 111 is, to within a 10% deviation, equal to the distance between the second vertical contact structure 123 and the first polysilicon conductive trace 111. The distance between the outer dummy-contact structure 129 and the inner dummy-contact structure 129 on the third sub-area 105c of the second active area 105 is, to within a 10% deviation, equal to a distance between the dummy-contact structure 129 on the third sub-area 103c of the first active area 103 and the second vertical contact structure 121.

Since only the dummy-contact structures 129 are arranged on the second active area 105, a connection of the second active area 105 from above is not possible. Particularly advantageous with the transistor 101 shown in FIG. 3A is that an aggressor, who carries out an invasive attack cannot identify in a picture taken from above the particular characteristics of the transistor 101, i.e. that a direct via of the lowest poly layer or the first polysilicon conductive trace exists, and that only a current flow in the first active area 103 is possible.

Figure 4:
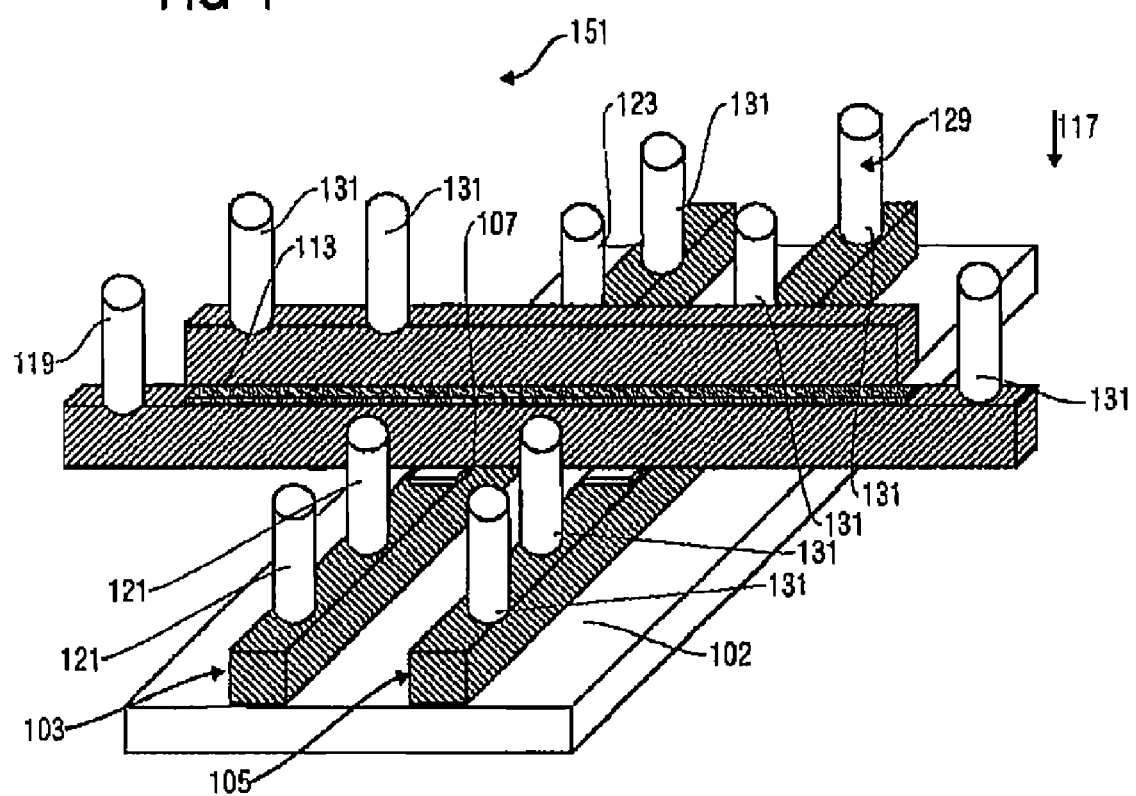
FIG. 4 shows a schematic view of a transistor on a chip for explaining the operation of the transistor in FIG. 3A.

This becomes clear in particular from a comparison with a transistor 151 without dummy-contact structures 129 shown in FIG. 4. Hereinafter, identical elements or elements with an identical function are designated by identical reference numerals. Furthermore, the description of the transistor 151 without dummy-contact structure 129 shown in FIG. 4 is limited to only a description of the differences with respect to the transistor 101 shown in FIG. 3A.

Contrarily to the transistor 101 shown in FIG. 3A, the dummy-contact structures 129 are replaced, in the transistor 151 shown in FIG. 4, by further contact structures 131. Of crucial importance is the fact that a viewer, who takes, during an invasive attack, a picture from above in the viewing direction 117, identifies in this picture an identical structure or projection as in the transistor shown in FIG. 3A. The transistor 151 shown in FIG. 4 is similar as to its structural construction or process structure to a memory transistor or a floating gate cell, which serves for implementing a non-volatile memory. In the memory transistor, the two polysilicon conductive traces 111, 115, which serve as gate conductor layers, replace a control gate arranged in a field-effect transistor. Thus, the transistor 101 in FIG. 3A with a direct via of the lowest poly layer 111, has a NVM-cell-like structure (NVM cell=Non-Volatile Memory cell), wherein the differences cannot be identified in a photographic picture taken from above.

Figure 5:
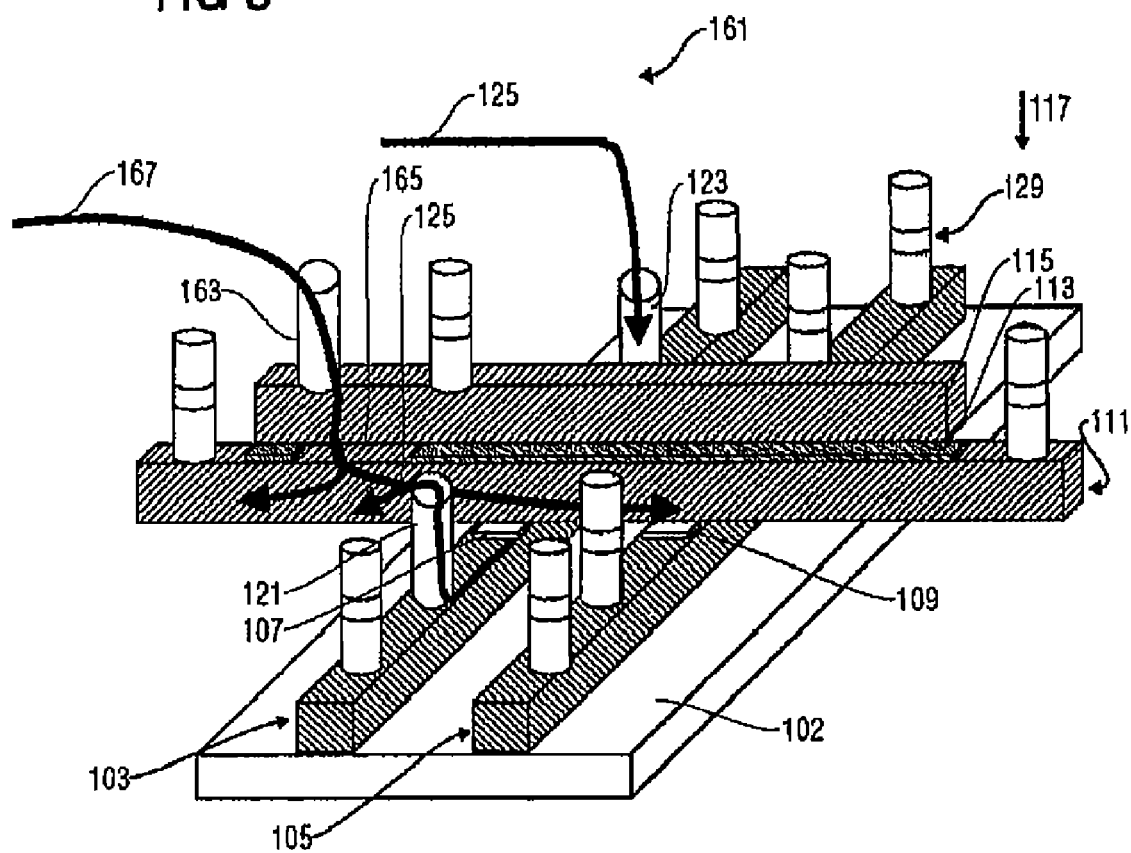
FIG. 5 shows a schematic view of a transistor on a chip according to an embodiment of the present invention, the transistor being connected by means of a via of an upper polysilicon layer.

FIG. 5 shows a schematic view of a transistor 161 that is implemented on a chip according to an embodiment of the present invention, and a via by means of a through-contact. Hereinafter, identical elements or elements with an identical function as the transistor 101 shown in FIG. 3A are designated by identical reference numerals. Furthermore, a description of the transistor 161 with via of the gate electrode by means of the through-contact shown in FIG. 5 is limited to a description of the difference in structure and operation with respect to the transistor 101 shown in FIG. 3A. At the same time, the definition of the sub-areas 103a-c, 105a-c, 111a-c of the active areas 103, 105 and the first polysilicon conductive trace 111 is maintained, the sub-areas being no longer represented in FIG. 5, for reasons of clarity.

Contrarily to the transistor 101 shown in FIG. 3A, the vertical conductive trace contact structure 119 is replaced by the dummy-contact structure 129. Furthermore, the dummy-contact structure 129 on the second polysilicon conductive trace 115 is replaced, near the third sub-area 111c of the first polysilicon conductive trace 111, by an upper vertical conductive trace contact structure 163, which extends from above to the second polysilicon conductive trace 115 and connects the second polysilicon conductive trace 115. At the same time, in the insulation layer 113 is formed a recess 165, which is filled with an electrically conductive material, so that the first polysilicon conductive trace 111 and the second polysilicon conductive trace 115 are electrically connected to each other through the recess 165.

As in the transistor 101 shown in FIG. 3A, in the transistor shown in FIG. 5 a current also flows from the second vertical contact structure 123 to the first vertical contact structure 121, the direction of which is also represented by the arrows 125. However, in contrast to the transistor 101, the adjustment of the potential of the control electrode of the transistor 161 does not occur through the lower vertical conductive trace contact structure 119, but the adjustment of the potential at the gate electrode occurs through the upper vertical conductive trace contact structure 163.

Since the first polysilicon conductive trace 111 and the second polysilicon conductive trace 115 are connected to each other through the electrically conductive material in the recess 165, the first polysilicon conductive trace 111 and the second polysilicon conductive trace 115 are at the same potential. This is also referred to as via of the upper multiple layer 115 or indirect gate via.

A particular advantage of the transistor 161, which is implemented on a chip according to an embodiment of the present invention is that the recess 165 in the insulation layer 113 can neither or only very difficultly be noticed in a top-down analysis. Especially in connection with the differences difficult to be detected between the dummy-contact structures 129 and the contact structures 121, 123, 163, an aggressor, who carries out an invasive attack can, because of the allegedly multiple vias, be so confused that he considers an analysis of the structure and the functionality of the chip according to an embodiment of the present invention with the transistor 161 is no longer possible.

The attention is again drawn here on the fact that the transistors 101, 151, 161 cannot be distinguished from each other in a picture taken in the viewing direction 117 from above in their structural representation on the photograph. As already explained, the transistors 101, 151, 161 have nevertheless clearly different functionalities.

Figure 6:
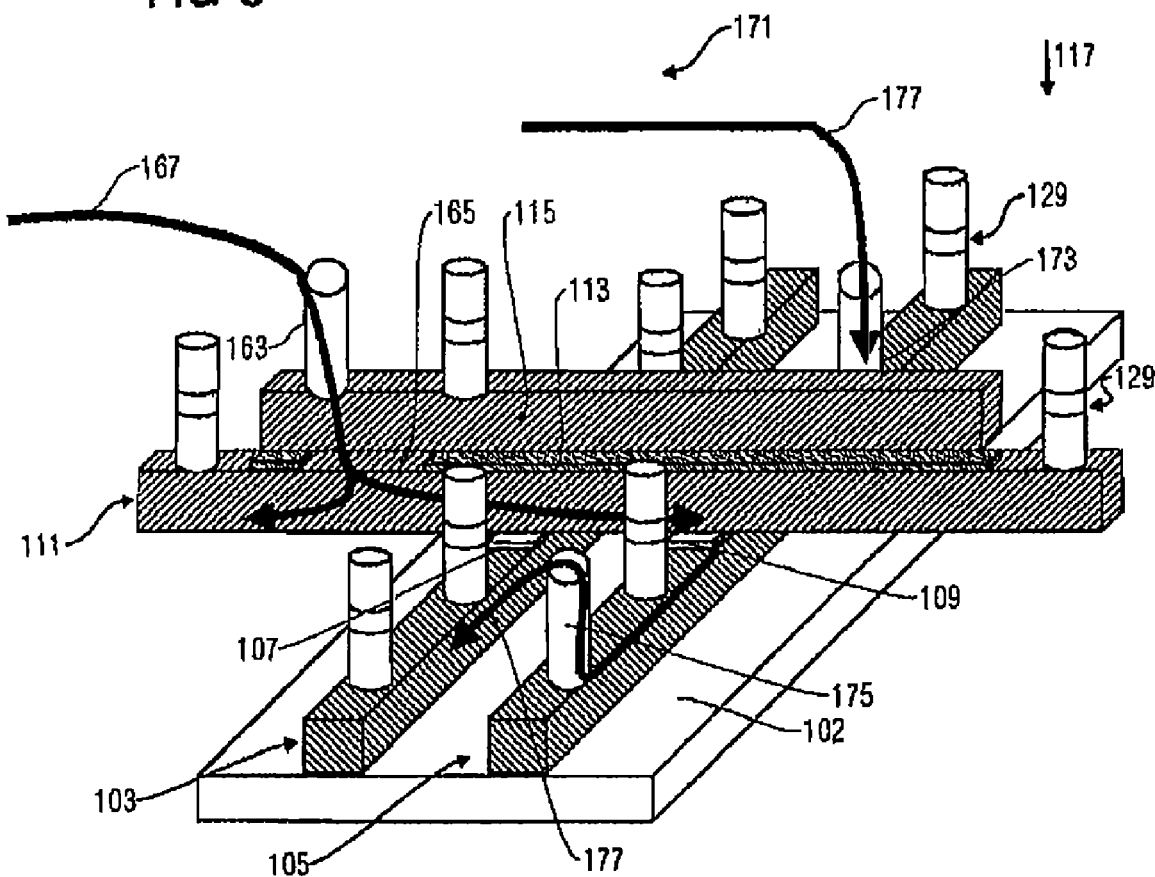
FIG. 6 shows a schematic view of a transistor on a chip according to an embodiment of the present invention, the transistor being also connected through a via of an upper polysilicon layer.

In FIG. 6 is shown a schematic view of a transistor 171 on a chip according to an embodiment of the present invention, which is also provided with a via by means of a through-contact from the upper polysilicon layer 115 to the lower polysilicon layer 111. The transistor 171 shown in FIG. 6 differs however from the transistor 161 in FIG. 5 in an embodiment of the vias of the active areas 103, 105.

Hereinafter, identical elements or elements with identical functions as those in the transistor 161 shown in FIG. 5 are designated by identical reference numerals. Furthermore, the definition of the sub-areas 103a-c, 105a-c, 111a-c of the active areas 103, 105 and the first polysilicon conductive trace 111 is maintained, the sub-areas in the FIG. 6 being no longer represented, for reasons of clarity. In particular, during the description hereinafter of the transistor 171 in FIG. 6, only the differences in the structure and the operation with respect to the transistor 161 on a chip according to an embodiment of the present invention shown in FIG. 5 are explained.

The transistor 171 differs from the transistor 161 on the one hand in that in the transistor 171 the vertical contact structures 121, 123 are replaced by the vertical dummy-contact structures 129. Furthermore, the inner dummy-contact structure 129, which extends, in the transistor 161, up to the third sub-area 105c of the second active area 105 and which is arranged between the first polysilicon conductive trace 111 and the outer dummy-contact structure 129, is replaced by a third vertical contact structure 173, while the outer dummy-contact structure 129, which extends up to the first sub-area 105a of the second active area 105, is replaced by the fourth vertical contact structure 175.

Arrows 177 in FIG. 6 explain a direction of the current flow through the second active area 105. Of a particular importance is here the fact that, in contrast to the transistor 161, in the transistor 171 a current flow from the third vertical contact structure 173 to the fourth vertical contact structure 175 through the second active area 105 can now be influenced or controlled through the potential at the upper vertical conductive trace contact structure 163. Although no differences can be identified in a top-down analysis or a picture of the transistors 161, 171 taken from above, the transistor 161 differs, as a matter of fact, from the transistor 171 in that in the transistor 161 the second active area 105 is connected only to the dummy-contact structures 129, so that only the current flowing through the first active area 103 is controlled, and that in the transistor 171 the first active area is connected only to the dummy-contact structures 129, so that only the current passing through the second active area 105 is controlled. Because of the identical pictures or structure images in the photograph taken from above or during the top-down analysis, as already explained, it is impossible for an aggressor, who carries out an invasive attack, to identify the differences in functionality of the transistors 161, 171 in the photographic images.

Figure 7:
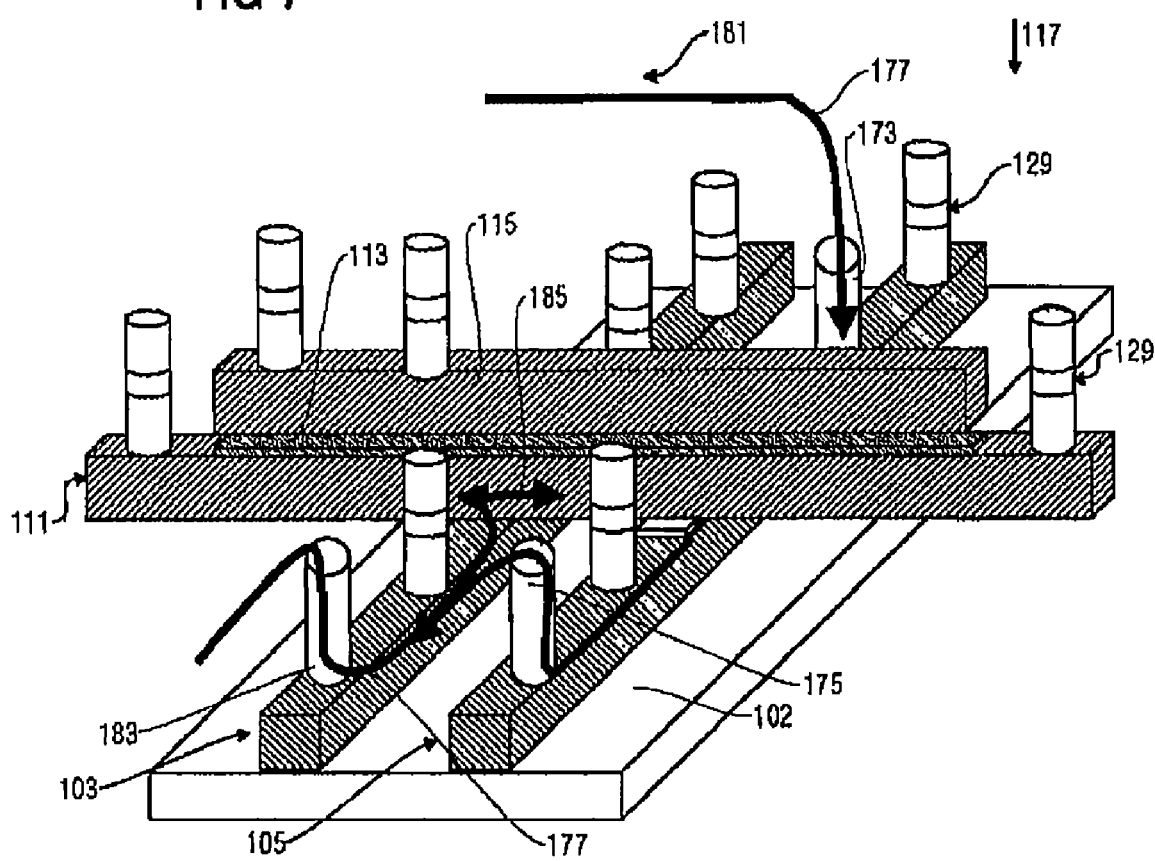
FIG. 7 shows a schematic view of a transistor on a chip according to an embodiment of the present invention, a control electrode being connected through an active area of the transistor structure in the transistor.

In FIG. 7 is shown another possibility of adjusting a potential at a gate electrode of a transistor, the via of the gate electrode occurring through a diffusion zone in one of the active areas 103, 105. The aim is, here too, to confuse an aggressor, who carries out an invasive attack. In FIG. 7 is shown to this end a schematic view of a transistor 181 with a gate connection through the first active area 103 on a chip according to an embodiment of the present invention. Hereinafter, identical elements or elements with an identical function as in the transistor 171 shown in FIG. 6 are designated by identical reference numerals. Furthermore, the definition of the sub-areas 103a-c, 105a-c, 111a-c of the active areas 103, 105 and the first polysilicon conductive trace 111 is maintained, the sub-areas mentioned in FIG. 7 being no longer represented, for reasons of clarity. Furthermore, a description of the transistor 181 shown in FIG. 7 is limited to a description of the differences in structure and function with respect to the transistor 171 shown in FIG. 6.

In contrast to the transistor 171, in the transistor 181 the first gate oxide 107 is not arranged between the first polysilicon conductive trace 111 and the first active area 103, but between the first active area 103 and the first polysilicon conductive trace 111 is arranged an electrically conductive material through which the first polysilicon conductive trace 111 and the first active area 103 are connected to each other. Furthermore, the outer dummy-contact structure 129 in the first sub-area 103a of the first active area 103 is replaced by a fifth vertical contact structure 183, which extends up to the first active area 103 and serves for connecting the first active area 103 from above. Furthermore, the upper vertical conductive trace contact structure 163 is replaced by the dummy contact structure 129.

Through the fifth vertical contact structure 183 can be adjusted the potential in the first active area 103, the first active area 103 being indeed connected in an electrically conductive way to the first polysilicon conductive trace 111, which in the transistor 181 serves as a gate electrode. Thus, a connection of the lowest poly layer or the gate electrode occurs e.g. through a connection of a diffusion zone in the active area 103. Therefore, one also speaks of an indirect gate connection.

An aggressor, who carries out an invasive attack cannot identify in a picture taken from above that, in contrast to the transistor 171, the connection of the first polysilicon conductive trace 111 does here no longer occur through the upper vertical conductive trace contact structure 163 arranged thereon, but through the fifth vertical contact structure 183 connected in an electrically conductive way to the first active area 103. This makes it more difficult for the aggressor to analyze the functionality of the chip according to an embodiment of the present invention with the transistor 181 in the picture taken from above and to eventually reproduce the chip with the transistor 181.

It clearly appears from the transistors 101, 161, 171, 181 represented in FIGS. 3A, 5-7 that thanks to the different arrangements of the dummy-contact structures 129 in the respective transistors 101, 161, 171, 181 result a series of connection possibilities and, hence, many different functionalities of the transistors. This results already into three possible connecting paths of the gate electrode, i.e. once through a via of the upper polysilicon layer 115 to the lower polysilicon layer 111, furthermore a direct connection of the lowest polysilicon layer 111, as in the transistor 101 in FIG. 3A, and, furthermore, a connection through the diffusion zone in the first active area 103, as shown in FIG. 7.

The possible connecting paths not only of the gate electrode, but also of the active areas 103, 105, delimit a range at will of connecting possibilities or allow a number at will of connecting implementations. An association of which of the contacts or contact structures then serves as source-drain or gate contact in the transistors 101, 161, 171, 181 by means of a top-down analysis or a picture taken from above is made more difficult or is no longer possible. Thus, the evolution of signals on the chip or in the silicon substrate can also no longer be reproduced with a top-down observation, but only by means of many cross-sectional photographs.

The multiplication by two of the contacts in the dummy-contact structures 129 and the vertical contact structures 119, 121, 123, 133, 163, 173, 175, 183 and the associated different variants for implementing a transistor construction and its function are easy to be carried out and causes only a small enlargement of the chip surface as well as an insignificant increase of the manufacturing cost. Because, for implementing the respective structural adjustments in the transistors 101, 161, 171, 181 in the FIGS. 3A, 5-7, the complexity of the processing or the number of the manufacturing steps is, in a production of the chip according to an embodiment of the present invention, which is implemented e.g. in a chip card, increased with only another contact-mask step and a manufacturing step of depositing a thin layer as well as a step of structuring the gate oxides 107, 109 and the insulation layer 113 between the polysilicon conductive traces 111, 115 or the Poly-Poly Interfaces. This corresponds only to using three additional masks in a production of a chip according to an embodiment of the present invention and to the corresponding process steps for the respective structuring.

It is in addition advantageous that, in a redesign measure, the dummy-contact structures 129 of unused transistors can be activated and, thus, that the synthesis algorithm can be adapted. Thus, so-called SOS cells or redundant structures, which were provided in the case of an improvement, are superfluous. The function of a chip according to an embodiment of the present invention on which are used the transistors with the dummy-contact structures 129 can thus be changed, without further transistors having to be added, during the redesign, to the original circuit design to this end, and without the structure of the implemented transistors having to be adapted to a considerable extent to this end.

Now is explained, with reference to the implementation of dummy transistors with the dummy-contact structures 129, how an impression of a transistor structure can be presented with an aggressor, who carries out an invasive attack, although the implemented element acts as an ohmic resistor or a capacitor.

Figure 8:
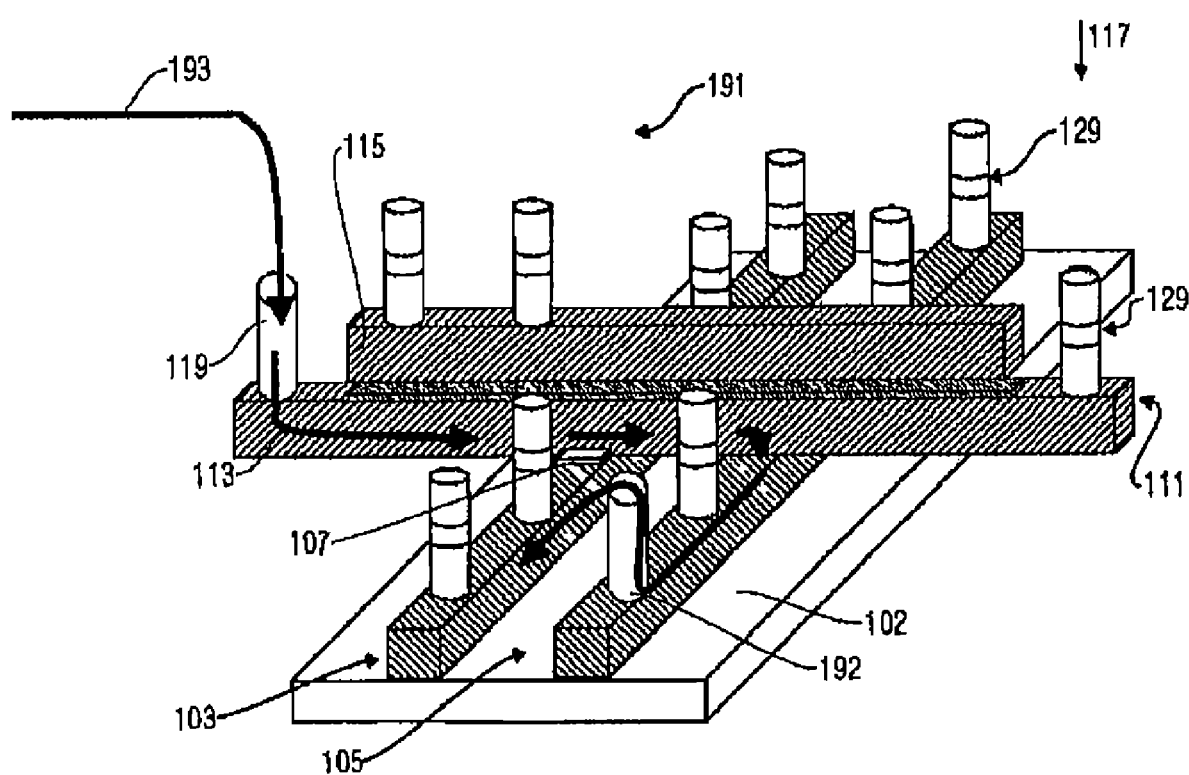
FIG. 8 shows a schematic view of a transistor structure on a chip according to an embodiment of the present invention, the transistor structure being used for implementing an ohmic resistor.

In FIG. 8 is shown to this end, in a schematic view, an ohmic resistor 191 with a connection of the lowest poly layer 111 as well as a current carrying through the second active area 105. Hereinafter, identical elements or elements having an identical function as the transistor 101 in FIG. 3A are designated by identical reference numerals. Furthermore, the definition of the sub-areas 103a-c, 105a-c, 111a-c of the active areas 103, 105 and the first polysilicon conductive trace 111 is maintained, the sub-areas in FIG. 8 being no longer represented, for reasons of clarity. Furthermore, the description of the ohmic resistor 191 is limited to only a description of the differences in function and structure with respect to the transistor 101.

In contrast to the transistor 101, the first vertical contact structure 121 and the second vertical contact structure 123 are replaced by the dummy-contact structures 129. Thus, the ohmic resistor 101 does no longer have vertical contact structures for connecting the first active area 103. On the first sub-area 105a of the second active area 105 is arranged, instead of the outer dummy-contact structure 129, the sixth vertical contact structure 192, which extends from the top to the second active area 105, is adjacent to the latter and is electrically connected to the second active area 105. Furthermore, between the second active area 105 and the first polysilicon conductive trace 111 is no longer arranged the second gate oxide 109, but, instead, in the area between the first polysilicon conductive trace 111 and the second active area 105 is arranged an electrically conductive material, which is formed e.g. on an out-diffusion during the generation of different doping zones in the active area. The electrically conductive material serves to electrically connect the first polysilicon conductive trace 111 and the second active area 105 to each other. Thus, the lower conductive trace contact structure 119 and the sixth vertical contact structure 192 are electrically connected to each other through the first polysilicon conductive trace 111 and the second active area 105 as well as through the conductive material arranged between the second active area 105 and the first polysilicon conductive trace 111.

This results, in the ohmic resistor 191, which is implemented in a chip according to an embodiment of the present invention, in a current evolution, which is represented by the arrows 193.

An aggressor, who carries out a top-down analysis, identifies in his picture taken from above only one structure of an element, which is similar to the transistors 101, 151, 161, 171, 181 shown above or is even identical for him, and, based on this picture, he does not come to the conclusion that an ohmic resistor is implemented, which is formed, e.g. in a series of chips, as a weakly doped zone of predetermined dimensions. Thus, the analysis of the circuit structure and its functionality is made more difficult for him.

Figure 9:
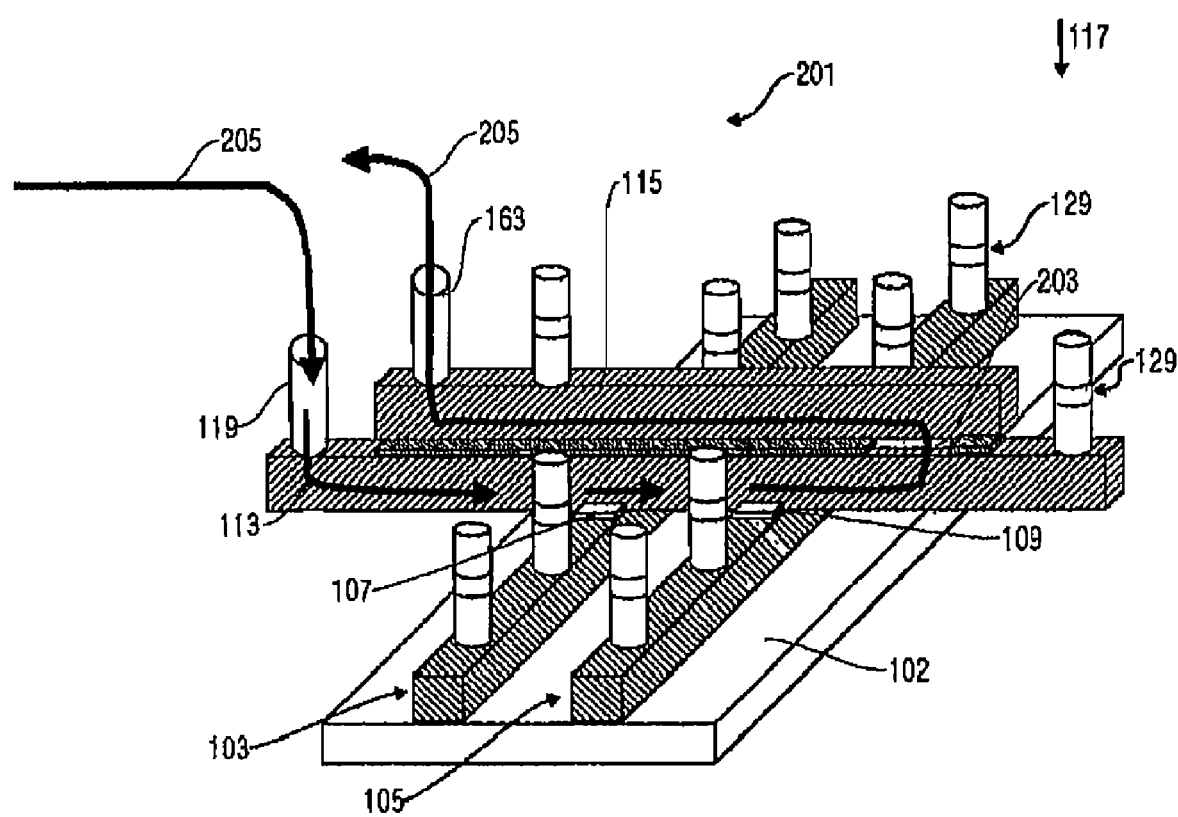
FIG. 9 shows a schematic view of a transistor structure on a chip according to an embodiment of the present invention, which serves for implementing an ohmic resistor with current carrying in opposite directions in two conductive traces arranged above each other.

A schematic view of another form of implementation of another ohmic resistor 201 on a chip according to an embodiment of the present invention is shown in FIG. 9.

Hereinafter, identical elements or elements having an identical function as the ohmic resistor 191 are designated by identical reference numerals. Furthermore, the definition of the sub-areas 103a-c, 105a-c, 111a-c of the active areas 103, 105 and the first polysilicon conductive trace 111 is maintained, the sub-areas in FIG. 9 being no longer represented, for reasons of clarity. Furthermore, the description of the construction and the functionality is limited to only a description of the differences in construction and functionality with respect to the ohmic resistor 191 shown in FIG. 8.

In contrast to the ohmic resistor 191, the sixth vertical contact structure 192 is replaced, in the other ohmic resistor 201, by the dummy-contact structure 129. Thus, only the dummy-contact structures 129 are arranged on the active areas 103, 105, so that no connecting possibilities for the active areas 103, 105 are provided for in the ohmic resistor 201. In addition, close to an end, facing toward the third sub-area 111c, of the second polysilicon conductive trace 115 is arranged the upper vertical contact structure 163, while, in the ohmic resistor 191, the dummy-contact structure 129 is arranged at that location. Furthermore, between the second active area 105 and the first polysilicon conductive trace 111 is arranged the gate oxide 109, and a recess 203 is formed in the insulation layer 113. The recess 203 has an electrically conductive material, so that the first polysilicon conductive trace 111 and the second polysilicon conductive trace 115 are electrically connected to each other through the electrically conductive material in the recess 203.

Since only the dummy-contact structures 129 are arranged on the active areas 103, 105, and the active areas 103, 105 are separated from the polysilicon conductive traces 111, 115 by the gate oxides 107, 109, no current flows in the active areas 103, 105 in the ohmic resistor 201. Instead, when applying a tension between the lower conductive trace contact structure 119 and the upper conductive trace contact structure 163, a current flows through the first polysilicon conductive trace 111, the recess 203 and the second polysilicon conductive trace 115, a direction of the current flow being characterized by arrows 205.

The advantage of the implementation so selected of the ohmic resistor 201 in a chip according to an embodiment of the present invention consists in that the resistor chain formed therein is implemented in a component structure in the form of the signal path or current path described by the polysilicon conductive traces 111, 115, which cannot be distinguished from a synthesized gate trench or a redundant logic cell in the top-down analysis.

In an ohmic resistor 201 that is implemented on a chip according to another embodiment of the present invention, it is advantageous that the recess 203 is arranged in a zone, which is separated by less than 0.3 times a length of the second polysilicon conductive trace 115 from the ends of the second polysilicon conductive trace 115. The length of the conductive trace 115 is defined as the distance over which the second polysilicon conductive trace 115 extends, perpendicularly to the vertical viewing direction 117, from a first end of the polysilicon conductive trace 115 close to the first sub-area 111a of the first polysilicon conductive trace 111 to a second end of the polysilicon conductive trace 115 close to the third sub-area 111c of the first polysilicon conductive trace 111.

In a chip according to another embodiment of the present invention, the ohmic resistor 201 is so implemented that the polysilicon conductive traces 111, 115 have an elongated form, so that a length or a horizontal extension perpendicular to the direction 117 of the first polysilicon conductive traces 111 or the second polysilicon conductive trace 115 is more than five times larger than a thickness of the polysilicon conductive trace 111 or the polysilicon conductive trace 115, a thickness of the polysilicon conductive traces 111, 115 being defined as an extension in the vertical direction 117. At the same time, the length of the polysilicon conductive traces 115 is larger than a width perpendicular to the direction 117. Because of the dimensions so selected, a necessary resistance value of the ohmic resistor can be brought about.

Another electrical component that is implemented on a chip according to an embodiment of the present invention is a capacitor 211 the construction of which is shown in a schematic view in FIG. 10. Hereinafter, identical elements or elements having an identical function as the ohmic resistor shown in FIG. 9 are designated by identical reference numerals. Furthermore, the definition of the sub-areas 103a-c, 105a-c, 111a-c of the active areas 103, 105 and the first polysilicon conductive trace 111 is maintained, the sub-areas in FIG. 10 being no longer represented, for reasons of clarity. Furthermore, a description of the construction and the operation of the capacitor 211 is limited to a description of the differences in construction and operation with respect to the ohmic resistor 201 shown in FIG. 9.

In contrast to the ohmic resistor 201 shown in FIG. 9, the insulation layer 113 has no recess. The insulation layer 113 extends, as shown in FIG. 10, from the first end of the second polysilicon conductive trace 115 to the second end of the polysilicon conductive trace 115, and is arranged between the polysilicon conductive traces 111, 115 so that it electrically insulates the polysilicon conductive traces 111, 115 from each other. Thus, a conductive connection or a direct conductive connection through an electrically conductive material, which is adjacent to both polysilicon conductive traces 111, 115 is not possible. Therefore, in the component structure shown in FIG. 10 is formed a capacitance or a capacitor, wherein the capacitive behavior of the polysilicon conductive traces 111, 115, which form two large-surface electrodes arranged close to each other, can be used. Arrows 213 show a direction of a current flow in a charging operation or a discharge operation of the so formed capacitor 211. As already explained above, it also applies for the capacitor 211 that the structure of the capacitor 211 cannot be distinguished, in a top-down analysis, from a synthesized gate trench, so that an aggressor, who carries out an invasive attack cannot identify the so implemented capacitor in the top-down analysis.

In the contact-structure arrangement 11 as well as in the components on a chip according to an embodiment of the present invention shown in FIGS. 3A, 5-10, the dummy-contact structures 17 have two contact structures, i.e. an upper contact area 17a, and a lower contact area 17c, which are separated from each other by the insulation layer 17b. The dummy-contact structure 17, 129 could, in a chip according to another embodiment of the present invention, however have any number of contact areas, and also any number of insulation layers, which respectively separate the contact structures from each other. In addition, the insulation layer 17b could also be arranged at the upper end or at the lower end of the dummy-contact structure 17, 129, thus at the end facing away from the functional area of the chip or at the end facing toward the functional area of the dummy-contact structure 17.

Furthermore, the dummy-contact structure 17, 129 has a conductive material, which is identical to the conductive material of the vertical contact structure 13, 15, 119, 121, 123, 163, 173, 175, 183, 192. In chips according to another embodiment of the present invention, the dummy-contact structure could however also have conductive materials, which are different from the conductive materials of the vertical contact structures 13, 15, 119, 121, 123, 163, 173, 175, 183, 192. In a chip according to an embodiment of the present invention, a dimension of the dummy-contact structure 17, 129 is, to within a 10% tolerance, equal to a dimension of the vertical contact structures for connecting the functional area 103, 105, 111, 115, e.g. the predetermined length or the dummy-contact structure length $L_{17}$ being equal to the length $L_{13}$ or the predetermined length of the first contact structure or the length $L_{15}$ of the second contact structure. Or a diameter of the circular dummy-contact structure 17 is, e.g. to within a 10% tolerance, equal to a diameter of the vertical contact structure 13 or the vertical contact structure 15. In a chip according to another embodiment of the present invention, a dimension of the dummy-contact structure 17, 129 could however be different from a dimension of the vertical contact structures for connecting the functional area.

In the chip according to an embodiment of the present invention, which has the dummy-contact structures 17, 129, a thickness $t_{17b}$ is smaller than 50% of the length $L_{13}$, $L_{15}$ of the vertical contact structures for connecting the functional area. In chips according to another embodiment of the present invention, arbitrary ratios between the thickness $t_{17b}$ of the insulation layer 17b and the length $L_{13}$, $L_{15}$ of the vertical contact structures for connecting the functional area are however alternatives. In a chip according to an embodiment of the present invention with the dummy-contact structures 17, 129, the vertical contact structure 13 has the length $L_{13}$ or the predetermined length $L_{13}$, which is larger than a root of a surface of a hole in which the vertical contact structure 13 is arranged or larger than a root of a surface of a hole in which the vertical dummy-contact structure 17 is arranged. In a chip according to another embodiment of the present invention, arbitrary ratios between a root of the surface of the hole in which the vertical contact structure or the dummy-contact structure is arranged and a predetermined length of the vertical contact structure are however alternatives.

In the chip according to an embodiment of the present invention, the insulation layer 17b of the vertical dummy-contact structure 17, 129 has a phosphorus-silicate glass material or a tetra-ethyl-ortho-silicate material, in a chip according to a further embodiment of the present invention the insulation layers in the dummy-contact structures 17, 129 can however have any insulating material.

In the chip according to an embodiment of the present invention, the insulation layer 17b is arranged between two metal layers, which extend e.g. horizontally and thus parallel to the chip plane, the dummy-contact structure 17, 129 extending, within a predetermined tolerance of 80° to 100°, vertically to the two metal layers or to the plane delimited by the metal layers. In a chip according to another embodiment of the present invention, the two metal layers can however be omitted, or the metal layers can be arranged according to any angle with respect to the dummy-contact structure 17, wherein the two metal layers themselves can also be arranged non-parallel to each other.

In the dummy-contact structures 17, 129 shown on a chip according to an embodiment of the present invention, the length $L_{17}$ of the dummy-contact structure 17 or a distance $L_{17}$ between the upper end of 17A of the dummy-contact structure 17 and the lower end 17B of the dummy-contact structure 17 is, to within a 10% tolerance, equal to the length $L_{13}$ of the first contact structure or the length of the conductive material in the first contact structure 13, however, in a chip according to a further embodiment of the present invention arbitrary ratios between the dummy-contact structure length $L_{17}$ and the length $L_{13}$, $L_{15}$ are alternatives.

In a chip according to an embodiment of the present invention, vertical dummy-contact structure 17, 129 and vertical contact structures 13, 15, 119, 121, 123, 163, 173, 175, 183, 192 are arranged substantially next to each other or arranged substantially not shifted vertically with respect to each other, so that e.g. a distance between a horizontal plane, in which the upper end 13A of the first vertical contact structure 13 is arranged and a horizontal plane, in which the upper end 17A of the vertical dummy-contact structure 17 is arranged is within a range below 10% of the length $L_{13}$ of the first vertical contact structure. Arbitrary arrangements of the vertical contact structures 13, 15, 119, 121, 123, 163, 173, 175, 183, 192 and the vertical dummy-contact structure 17, 129 with respect to each other are however alternatives.

In the components 101, 161, 171, 181, 191, 201, 211 on the chip according to an embodiment of the present invention, two polysilicon conductive traces 111, 115 are each time arranged one above the other. In chips according to another embodiment of the present invention, it can however be contemplated to make the two conductive traces of any material, such as e.g. aluminum, or to replace the two polysilicon conductive traces 111, 115 by one single polysilicon conductive trace or by several polysilicon conductive traces.

In a chip according to an embodiment of the present invention, the active areas 103, 105 are spaced from each other and have a zone or area, in which the doping is increased with respect to the substrate 102, or which has another type of doping than the substrate 102 or a higher conductivity than the substrate 102. In a chip according to another embodiment of the present invention, the two active areas 103, 105 could however also be implemented as a continuous active area, or, in a chip according to another embodiment of the present invention, the active areas 103, 105 could also be completely omitted.

In a chip according to another embodiment of the present invention, it can also be contemplated to change the arrangement of the vertical contact structures 119, 121, 123, 163, 173, 175, 192 and of the dummy-contact structures 129 arbitrarily as to their number or their position, wherein e.g. also one single vertical contact structure and one single vertical dummy-contact structure can extend into the functional area 103, 105, 111, 115 of the chip. Thus, components with arbitrary further connecting possibilities and functionalities can be generated on a chip according to another embodiment of the present invention.

In particular, in a chip according to another embodiment of the invention, the ohmic resistor shown in FIG. 8 could be modified in that the dummy-contact structure 119 on the second polysilicon conductive trace 115 close to the third sub-area 111c is replaced by the upper vertical conductive trace contact structure 163, and the lower conductive trace contact structure 119 is replaced by the dummy-contact structure 129. When, in addition, in the insulation layer 113 is generated the recess 123, which is filled with the conductive material, so that the first polysilicon conductive trace 111 and the second polysilicon conductive trace 115 are electrically connected, a via could thereby be generated by the upper polysilicon layer 115 to the lower polysilicon layer 111 in the ohmic resistor 191.

Furthermore, it could be contemplated to omit the gate oxide 107 or the gate oxide 109, provided they are present, in the components 101, 161, 171, 181, 191, 201, 211 or to replace them by a conductive material, whereby the functionality of the components would under some circumstances change, or also to use any insulating material instead of the gate oxide. In the components 101, 161, 171, 181, 191, 201, 211, the first gate oxide 107 or the second gate oxide 109 has a thickness, which is in a range of less than half of the thickness of the first polysilicon conductive trace or the thickness of the second polysilicon conductive trace in a chip according to an embodiment of the present invention. In a chip according to another embodiment of the present invention, a thickness of the first gate oxide or the second gate oxide is even in a range of less than 0.1 times the thickness of the first polysilicon conductive trace or the thickness of the second polysilicon conductive trace. Arbitrary ratios between the thickness of the first gate oxide or the second gate oxide and the thickness of the first polysilicon conductive trace 111 or the thickness of the second polysilicon conductive trace 115 are however alternatives.

In the components 101, 161, 171, 181, 191, 201, 211 on a chip according to an embodiment of the present invention, the insulation layer 113 has an insulating material, e.g. a so-called ONO material, however, the insulation layer 113 could, in a chip according to another embodiment of the present invention, be made out of any non-electrically conductive material. A ratio between a thickness of the insulation layer 113 and the length of the vertical contact structure 13, 15, 119, 121, 123, 163, 173, 175, 183, 192 is, in a chip according to an embodiment of the present invention, in a range of less than 0.5 and, in a chip according to another embodiment of the present invention, even in a range of less than 0.1, however, arbitrary ratios between the thickness of the insulation layer 113 and the length $L_{13}$, $L_{15}$ of the vertical contact structure are alternatives.

Furthermore, the electrical components 161, 171, 201 have the recess 203 in the insulation layer 113. The recess 203 has any electrically conductive material and can, in chips according to another embodiment of the present invention, have arbitrary horizontal dimensions, which are smaller than the length of the second polysilicon conductive trace 115. Likewise, with a chip according to another embodiment of the present invention, the recess 203 can be arranged at arbitrary locations in the insulation layer 113 or even a plurality of recesses can be formed in the insulation layer 113.

The first active area 103 or the second active area 105 have an elongated shape, a length in a direction perpendicular to the polysilicon conductive trace 111, 115, from a first end of the active area 105, 103 to the second end, facing away from the first end, of the active area 103, 105, being more than five times larger than a thickness of the active area 103, 105 in the vertical direction 117. In a chip according to another embodiment of the present invention, arbitrary shapes of the first active area 103 and the second active area 105 can however be contemplated.

The first active area 103 or the second active area 105 intersect the polysilicon conductive traces 111, 115 in the components 101, 161, 171, 181, 201, 211 within predetermined tolerances or substantially perpendicularly, so that the first polysilicon conductive traces 111 and the first active area 103 or the second polysilicon conductive trace 115 and the second active area 105 each form an angle in a range from 80° to 100°, however, arbitrary arrangements of the first active area 103 with respect to the second active area 105 and arbitrary angles between the first active area 103 and the polysilicon conductive traces 111, 115 or second active area 105 and the polysilicon conductive traces 111, 115 can be contemplated in chips according to another embodiment of the present invention. The parallel arrangement of the active areas 103, 105 in the components 101, 161, 171, 181, 191, 201, 211 could, in a chip according to another embodiment of the present invention, also be replaced by any arrangement of the active areas 103, 105 with respect to each other.

In the components 101, 161, 171, 181, 191, 201, 211, the polysilicon conductive traces 111, 115 have an elongated shape, a length in a direction perpendicular to the active areas 103, 105 and perpendicular to the direction 117 in the top view or a distance between a first end of the polysilicon conductive traces 111, 115 and a second end, facing away from the first end, of the polysilicon conductive traces 111, 115 being five times larger than a thickness of the polysilicon conductive traces 111, 115 in the direction 117 vertical to the chip plane. In chips according to another embodiment of the present invention, arbitrary shapes of the polysilicon conductive traces can however be contemplated, or also only some polysilicon conductive trace could have the above-mentioned ratios between the dimensions.

In the electrical components 101, 161, 171, 181, 191, 201, 211, the first polysilicon conductive trace 111 has in the top view, in the direction 117 vertical to the chip plane, a larger surface than the second polysilicon conductive trace 115, which is arranged above the first polysilicon conductive trace 111, so that the total area of the second polysilicon conductive trace 115 overlaps with the first polysilicon conductive trace 111 in the top view in the direction 117. In addition, the first polysilicon conductive trace 111 and the second polysilicon conductive trace 115 are arranged substantially parallel to each other. However, in a chip according to another embodiment of the present invention, arbitrary arrangements of the second polysilicon conductive trace 115 with respect to the first polysilicon conductive trace 111 in the top view in the direction 117 can be contemplated, so that the first polysilicon conductive trace 111 and the second polysilicon conductive trace 115 can also be arranged non-parallel to each other. In a chip according to another embodiment of the present invention, a horizontal offset of the first polysilicon conductive trace 111 with respect to the second polysilicon conductive trace 115 could also be contemplated.

In the components 101, 161, 171, 181, 201, 211 on a chip according to an embodiment of the present invention, the active areas 103, 105 and the polysilicon conductive traces 111, 115 are electrically insulated by the STI from the substrate 102. In a chip according to another embodiment of the present invention, it can however also be contemplated to use arbitrary materials or layers, in order to electrically insulate the functional area 103, 105, 111, 115 from the substrate 102.

In the above components 11, 101, 161, 171, 181, 191, 201, 211, the insulation layer 17b was generated during the generation of a horizontally extending layer made out of an insulating material in the chip. Alternatively, the insulation layer 17b could also be formed in that the vertical contact structure 13, 15, 19, 21, 23, 63, 73, 75, 83, 92 or the conductive material of the vertical contact structures is partly removed and in that, in a thus formed trench area, an insulation layer is then applied on the remaining conductive material, on which conductive material is then again applied. Arbitrary methods for producing the insulation layer in the dummy-contact structure are however alternatives.

In the components 101, 161, 171, 181, 191, the first active area 103 or the second active area 105 could have a width in a direction parallel to the polysilicon conductive traces 111, 115 such that, besides the vertical contact structures 122, 123, 175, 183, 192 parallel to the polysilicon conductive traces 111, 115, the dummy-contact structure 129 or a plurality of dummy-contact structures 129 can be arranged, the dummy-contact structure 129 or the plurality of dummy-contact structures extending up to the first active area 103 or the second active area 105. In other words, the dummy-contact structure 129 can then be so arranged with respect to the vertical contact structure that the dummy-contact structure 129 and the vertical contact structure are arranged on a line perpendicular to the vertical direction 117 and parallel to the first polysilicon conductive trace 111 or the second polysilicon conductive trace 115.

Furthermore, in a chip according to another embodiment of the present invention, the lower conductive trace contact structure 119 in the transistor 101 could be replaced by the dummy-contact structure 129 and one of the dummy-contact structures 129, which extend up to the second polysilicon conductive trace 115 could be replaced by a vertical contact structure continuously filled with electrically conductive material. In the transistor so construed, a load could be generated in the first polysilicon conductive trace 111, in a way similar to an operation as in a flash cell, by means of the Fowler-Northeim effect or the channel-hot-electron effect through an adjustment of a potential at the vertical contact structure extending up to the second polysilicon conductive trace 115.

The load thus generated in the first polysilicon conductive trace 111 and the electrical field created by same could then have an influence e.g. on a current flow in the active area 103 or the active area 105. In such a modification of the transistor 101, it would be particularly advantageous that the programming or the adjustment of the charge in the first polysilicon conductive trace 111 could already occur during the manufacturing of the chip according to another embodiment of the present invention, which would make it even more difficult for a possible aggressor to reconstruct the circuit functionality implemented on the chip according to another embodiment of the present invention.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A chip with a chip plane, comprising:
   a functional area comprising:
      a first active area and a second active area, which is spaced from the first active area;
      a first conductive trace, which crosses the first and second active areas, wherein a first insulating layer is arranged between the first active area or the second active area and the first conductive trace; and
      a second conductive trace, which is arranged above the first conductive trace, wherein a second insulating layer is arranged between the second conductive trace and the first conductive trace;
   a plurality of contact structures vertical with respect to the chip plane for contacting the first active area, the second active area, the first conductive trace or the second conductive trace, wherein the vertical contact structures include a conductive material; and
   a vertical dummy-contact structure, which extends vertically into the functional area to the first active area, the second active area, the first conductive trace or the second conductive trace, and which comprises an electrically conductive material and an insulation layer, the insulation layer being formed so that a current flow from an upper end of the dummy-contact structure to the functional area is prevented;
   wherein the vertical contact structures comprise
      a first vertical contact structure extending up to the first conductive trace, being spaced from the second conductive trace and representing a gate contact of a transistor implemented by the functional area, and a second vertical contact structure extending up to the first or second active area, being spaced from the first contact structure and the first conductive trace and representing a source/drain contact of the transistor, and a third vertical contact structure extending up to the first or second active area, being spaced from the first contact structure and the first conductive trace and representing a further source/drain contact of the transistor;
   wherein the dummy-contact structures comprise
      a first dummy-contact structure extending up to one of the first conductive trace and the second conductive trace and being spaced from the other of the first conductive trace and the second conductive trace, and a second dummy-contact structure extending up to the first active area or the second active area.

2. The chip according to claim 1, wherein the dummy-contact structure comprises:
   a first area of the conductive material, which is connected in a conductive way to the functional area, and a second area of the conductive material, which is arranged on the insulation layer and is electrically insulated from the first area by the insulation layer.

3. The chip according to claim 1, wherein the insulation layer of the dummy-contact structure is arranged on the functional area and covers at least partly the functional area, and the conductive material is arranged on a side of the insulation layer facing away from the functional area.

4. The chip according to claim 1, wherein the conductive material is arranged at the upper end of the vertical dummy-contact structure.

5. The chip according to claim 1, wherein the conductive material of the vertical dummy-contact structure is identical to the conductive material of the vertical contact structure.

6. The chip according to claim 1, wherein a vertical or horizontal dimension of the vertical dummy-contact structure is, to within a tolerance of 10%, equal to a vertical or horizontal dimension of the vertical contact structures.

7. The chip according to claim 1, wherein a thickness of the insulation layer is smaller than 50% of the length of the vertical contact structures.

8. The chip according to claim 1, wherein the conductive material of each of the vertical dummy-contact structure and the contact structures is arranged in a hole of the chip, a root of the area of the hole being smaller than the length of the vertical contact structures.

9. The chip according to claim 1, wherein the insulation layer of the dummy-contact structure is arranged between two metal layers surrounding the dummy-contact structure, the vertical dummy-contact structure being arranged, to within a predetermined tolerance from 80° to 100°, perpendicularly to one of the two metal layers.

10. The chip according to claim 1, wherein the vertical dummy-contact structure comprises a lower end facing away from the upper end, and a distance between the upper end and the lower end is, to within a 10% tolerance, identical to the length of the vertical contact structures.

11. The chip according to claim 1, wherein the vertical dummy-contact structure is arranged substantially parallel to the vertical contact structures for contacting the functional area, and the vertical contact structures comprise a lower end facing toward the functional area and an upper end facing away from the functional area, wherein an upper contact structure end plane, in which the upper end of the contact structure is located and which is parallel to the chip plane, is spaced by less than 10% of the predetermined length from an upper dummy-contact structure end plane, in which the upper end of the dummy-contact structure is located and which is also parallel to the chip plane.

12. The chip according to claim 1, further comprising a third dummy-contact structure, which is spaced from the first dummy-contact structure and the one of the first conductive trace or the second conductive trace and extends up to the other of the first conductive trace or the second conductive trace.

13. The chip according to claim 1, wherein the first conductive trace is subdivided into a first sub-area, a second sub-area and a third sub-area;
   wherein the second sub-area of the first conductive trace overlaps, in a plan view in a direction vertical to the chip plane, with the second conductive trace, and the first sub-area does not overlap, at a first end first of the conductive trace, in the plan view, with the second conductive trace, and the third sub-area of the first conductive trace does not overlap, in the plan view, with the second conductive trace, and extends up to the first end of the first conductive trace facing away from the second end of the first conductive trace;
   wherein the first vertical contact structure extends up to the third sub-area of the first conductive trace and the first vertical dummy-contact structure extends up to the first sub-area of the first conductive trace.

14. The chip according to claim 1, wherein the insulation layer is arranged continuously between the first conductive trace and the second conductive trace so that the first conductive trace is separated from the second conductive trace.

15. The chip according to claim 14, wherein the first conductive trace and the second conductive trace form the electrodes of a capacitor.

16. The chip according to claim 1, wherein the first active area and the second active area each comprise, on both sides of the first conductive trace, two contactings, which are formed either as contact structures or as dummy-contact structures.

17. The chip according to claim 1, wherein the first conductive trace and the second conductive trace each comprise two contactings, which are formed either as contact structures or as dummy-contact structures.

* * * * *